United States Patent
Bloemer et al.

(10) Patent No.: US 6,613,596 B2
(45) Date of Patent: Sep. 2, 2003

(54) MONOLITHICALLY INTEGRATED PHOTONIC CIRCUIT

(75) Inventors: Mark J. Bloemer, Athens, AL (US); Krishna Myneni, Huntsville, AL (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 38 days.

(21) Appl. No.: 10/153,490

(22) Filed: May 20, 2002

(65) Prior Publication Data
US 2002/0146191 A1 Oct. 10, 2002

Related U.S. Application Data

(62) Division of application No. 09/678,880, filed on Oct. 4, 2000.

(51) Int. Cl.[7] .................................................. H01L 21/00
(52) U.S. Cl. .............................. 438/24; 257/95; 385/1; 359/248

(56) References Cited

U.S. PATENT DOCUMENTS

| | | | |
|---|---|---|---|
| 4,759,023 A | * | 7/1988 | Yamaguchi .................. 372/26 |
| 5,770,472 A | * | 6/1998 | Zhou et al. ................... 438/24 |
| 6,198,757 B1 | * | 3/2001 | Broutin et al. ................ 372/32 |

* cited by examiner

*Primary Examiner*—Douglas A. Wille
(74) *Attorney, Agent, or Firm*—Arthur H. Tischer; Dayn T. Beam; Hay Kyung Chang

(57) ABSTRACT

In the monolithically integrated photonic circuit, light travels through multiple quantum well channel waveguides and is coupled into and out of the devices that reside in common on a single semiconductor substrate. Each device, which is co-planar with any other device on the substrate, is comprised of a quantum well channel waveguide of a predetermined length and an electrical contact pad mounted on the waveguide that facilitates the application of electric field to the device. The function of any particular device as an optical source, an optical modulator or a photo-detector is determined by the bias mode of electric field applied to that particular device. The circuit is comprised of multiple rows of such devices. Each of these rows contains at least three devices which function as an optical source, an optical modulator and a photo-detector, respectively, and are separated from each other by electrical isolation gaps.

1 Claim, 2 Drawing Sheets

MONOLITHICALLY INTEGRATED PHOTONIC CIRCUIT

DIVISIONAL APPLICATION

This application for patent is a divisional application of prior nonprovisional application, Ser. No. 09/678,880, filed on Oct. 4, 2000. The said prior application is hereby incorporated by reference herein.

DEDICATORY CLAUSE

The invention described herein may be manufactured, used and licensed by or for the Government for governmental purposes without the payment to us of any royalties thereon.

BACKGROUND OF THE INVENTION

Integration of optical source devices, optical modulating devices and photo-detecting devices on a single substrate to produce a photonic circuit has become an area of intense research in recent years as there are numerous advantages to such monolithic integration such as compact size, reduced weight and cost, and rugged construction of the photonic circuit.

Typically, waveguides are used to route the light to and through the various devices residing on the substrate. Recently waveguides incorporating quantum wells have been used as modulators and detectors by taking advantage of the occurrence of the large red shift of the absorption edge in the quantum wells when electrical field is applied. This red shift is referred to as the Quantum Confined Stark Effect (QCSE). For example, a GaAs quantum well under the influence of an applied field normal to the layers of the quantum wells will exhibit a large shift in the absorption edge due to the QCSE. The QCSE allows a waveguide that contains quantum wells to be used as an optical modulator or a detector.

The lithographic fabrication process for an integrated photonic circuit is much the same as the process for integrated electronic circuit except for the significant technical difficulty in integrating an optical modulator and a laser diode as optical source. The difficulty lies in the fact that laser sources require the inclusion of an epitaxial structure different from the rest of the circuit. The reason is that the optical modulator requires a semiconductor having a band gap energy that is different from that of the laser diode. The extant solution is to accomplish the monolithic integration of the laser diode through a multiple layer design in which the laser source is not co-planar with the other devices. Alternatively, etch-and-regrowth process can be performed which is costly and complex, requiring at least 12 steps.

SUMMARY OF THE INVENTION

In the monolithic integrated photonic circuit, light travels through multiple quantum well channel waveguides and is coupled into and out of the co-planar devices which reside on a single semiconductor substrate. Each of the devices is comprised of a quantum well channel waveguide of a pre-determined length and an electrical contact pad mounted on the waveguide, the contact pad facilitating the application of electric field to the device. The function of any particular device as an optical source, an optical modulator or a photo-detector is determined by the bias mode of electric field that is applied normal to the layers of that particular device.

The integrated photonic circuit is fabricated by growing and doping a semiconductor chip so that it is made up of layers that together exhibit a positive-intrinsic-negative doping profile where multiple quantum wells are contained in the middle layers. After placing the contact pads on the chip in a pre-arranged fashion, the chip is etched to a pre-determined depth, thereby producing a photonic circuit with raised waveguides with gaps between the waveguides for electrical isolation.

DESCRIPTION OF THE PREFERRED EMBODIMENT

Figure 1:
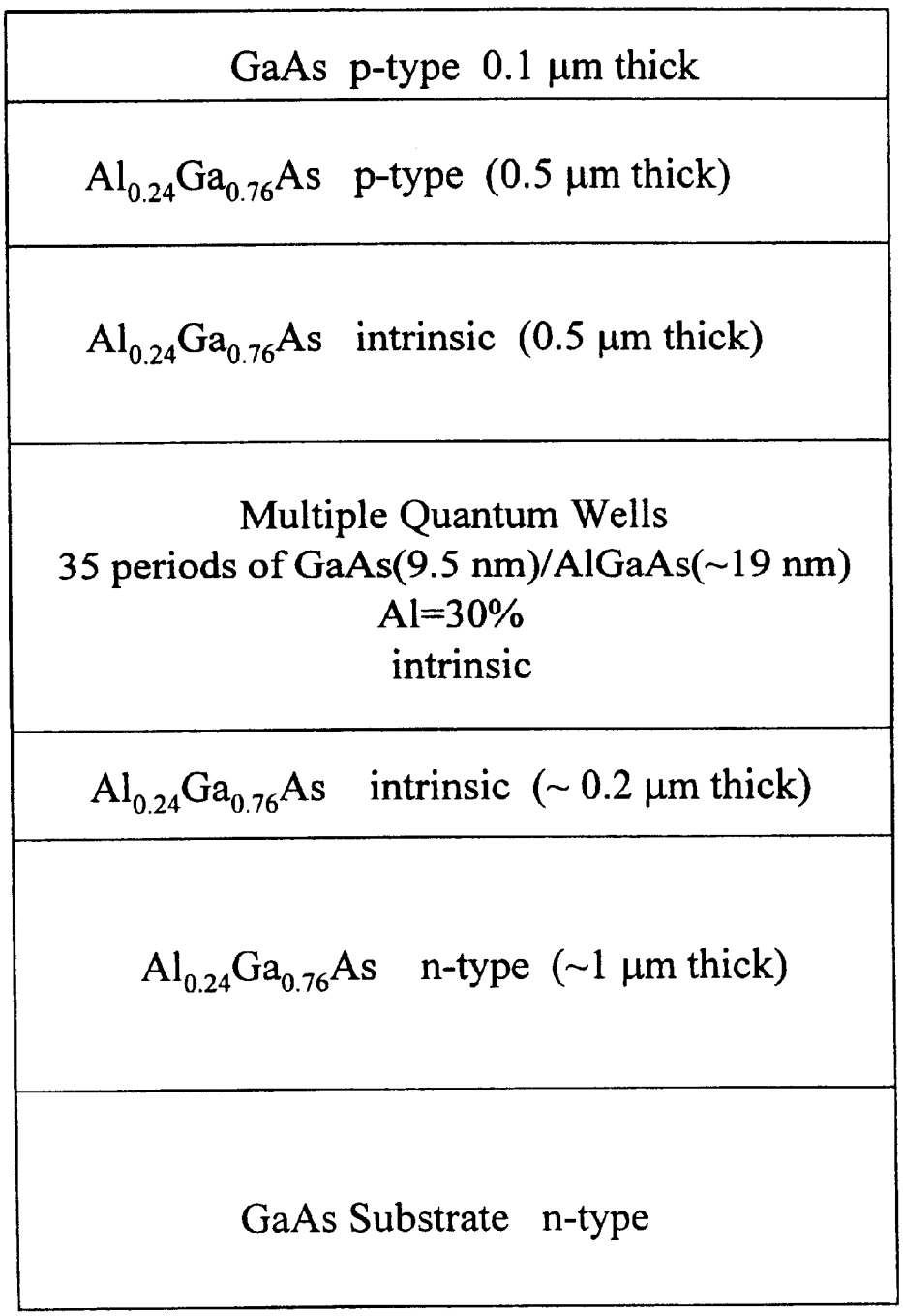
FIG. 1 illustrates a cross-section of a quantum well channel waveguide.

Referring now to the drawing wherein like numbers represent like parts in each of the figures, the structure and operation of the monolithic integrated photonic circuit are explained in detail.

The difficulties of the extant solution mentioned above are overcome by using as the sources quantum well light-emitting diodes (QWLED's) which combine the unique properties of semiconductor quantum wells and light emitting diodes. This combination completely eliminates the need for regrowth due to the fact that the optical source, optical modulator and photo-detector are identical in their internal structure but are operated differently by having applied thereto electric field in differing bias modes to optimize each device's function.

A semiconductor quantum well is a structure which has one or more dimensions smaller than the mean free path of an electron or hole. For GaAs, quantum effects become noticeable if the dimensions are smaller than 20 nm. For the integrated photonic circuit, the important effects of quantum confinement are the Quantum Confined Stark Effect (QCSE) and the sharp optical absorption edge. A direct current electric field applied normal to a quantum well results in a large red-shift of the energy levels and this shift can be used to make absorption and phase modulators.

Several features make light-emitting diodes attractive for single growth, monolithic integration of a photonic circuit that takes advantage of the QCSE. The broadband emission and the red shift of the emission with increasing injection current limit propagation loss, keeping it low, once the light leaves the source and propagates through the modulator and any passive sections of the photonic circuit. Light-emitting diodes, unlike laser diodes, do not require reflective surfaces to provide feedback. Eliminating reflective endfaces makes possible extremely low coupling losses between source-modulator and modulator-photodetector, about 0.1 dB per junction. In contrast, coupling losses for laser diodes and external modulators tend to be on the order of 10 dB.

As the cross-sectional FIG. 1 shows, in a representative quantum well channel waveguide structure grown by molecular beam epitaxy, the first layer on a GaAs substrate is a film of $Al_{0.24}Ga_{0.76}As$ which is about 1 $\mu$m thick and has a free carrier concentration of about $1\times10^{17}/cm^3$. The next layer is an undoped $Al_{0.24}Ga_{0.76}As$ film that is about 0.2 $\mu$m thick. Above this layer, the waveguide section contains 35 GaAs quantum wells, each well consisting of a 9.5 nm-thick GaAs layer sandwiched between barrier layers of $Al_{0.3}Ga_{0.7}As$, each barrier layer being about 19 nm thick. The upper cladding of the channel waveguide structure is a 1 μm-thick layer of $Al_{0.24}Ga_{0.76}As$ half of which is doped with Be to form a p-type semiconductor. As a result, the entire waveguide structure has a p-i-n doping profile. The final layer is a heavily doped GaAs cap to facilitate electrical contacts.

Figure 2:
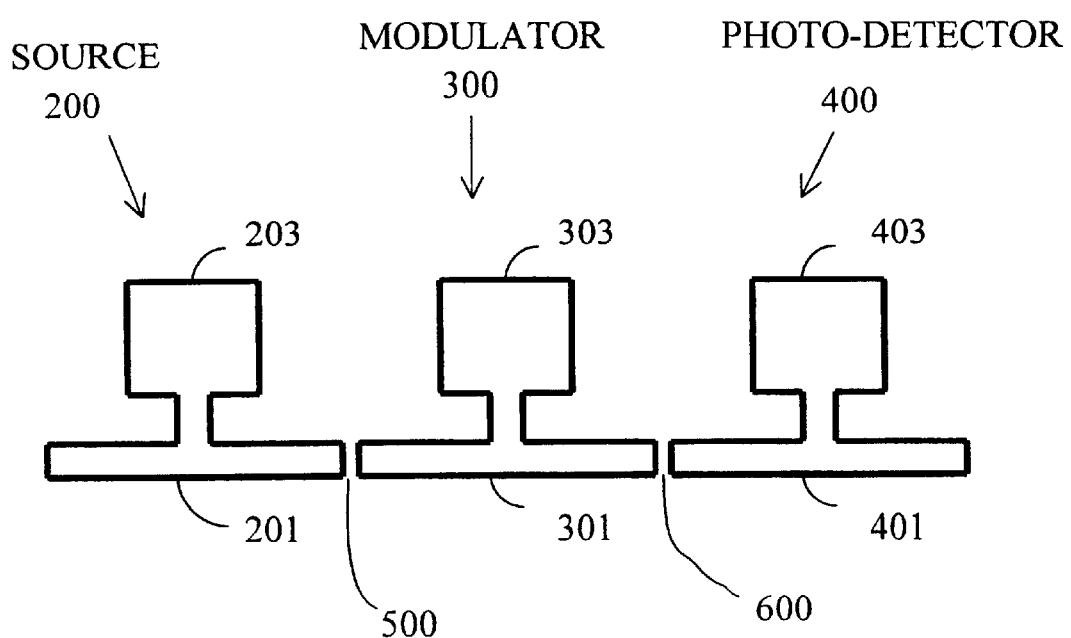
FIG. 2 is a diagram of a preferred embodiment of monolithic integrated photonic circuit incorporating a plurality of quantum well channel waveguides.

FIG. 2 is a diagram showing one representative row in a preferred embodiment of monolithic integrated photonic circuit that incorporates a plurality of such waveguides. The circuit comprises many such rows, each row, in turn, being comprised of optical source 200, optical modulator 300 and photo-detector 400. The optical source, optical modulator and photo-detector are identical in their internal structure but function differently to perform the emission, electro-absorption modulation and detection of light, respectively, when electric field is applied to them in a predetermined bias pattern.

The photonic circuit, as depicted representatively in FIG. 2, is fabricated by depositing electrical contacts in even distribution on the semiconductor chip whose structure is as described above with reference to FIG. 1. Thereafter, the chip is patterned with a photoresist stripe to form channel waveguides, each waveguide being about 100 μm in length and the photoresist stripe having gaps that are about 10 μm wide at intervals of about 100 μm. The purpose of the gaps is to provide electrical isolation to the resulting waveguides from each other. The chip is then placed in an ion mill to pattern the electrical contacts and subsequently wet-etched to a total depth of about 1.0 μm. This process results in a series of channel waveguides, each topped by a raised contact pad which is approximately 50 μm×50 μm square and separated from the adjacent waveguide on all sides by the isolation gaps each of which is about 10 μm wide. Since the source, modulator and photo-detector are identical in their internal structure, this fabrication technique is highly repeatable and requires 4× fewer steps than the typical regrowth technique. Further, the electrical resistance between any two adjacent waveguides is greater than 30 MΩ.

The monolithically integrated photonic circuit resulting from the above-described process is illustrated in FIG. 2 which shows a representative row of the components of the circuit. Such a row contains optical source 200 comprised of waveguide 201 and contact pad 203, optical modulator 300 comprised of waveguide 301 and contact pad 303 and photo-detector 400 comprised of waveguide 401 and contact pad 403 with gaps 500 and 600 positioned between the waveguides to provide electrical isolation. Even though the waveguides are shown in the drawing to be of equal length, they may be of different lengths.

When optical source 200 is forward-biased by injection current of, say 10–30 mA, the electrons and holes recombine to emit light. The light emitted from the quantum well light-emitting diode that is the optical source is coupled to optical modulator 300. The modulator is reverse-biased with a ramped voltage to utilize the quantum confined stark effect. For a source injection current of 15 mA and a 1 mm modulator waveguide length with an applied voltage of 0 V to −30 V, the measured power modulation is about 4.9 dB. From modulator 300, the remaining light is coupled to photo-detector 400 which is reverse-biased with a constant voltage to shift the absorption edge of the quantum wells in order to convert the light into electrical current. For a photo-detector that is 3.2 mm long and reverse-biased at −30 V, the dark current is about 32 nA, indicating that the detector current is directly proportional to the absorbed power.

Due to the broadband nature of the emission from a quantum well light-emitting diode source and the sharpness of the absorption edge in quantum wells, a significant portion of the emitted light can propagate through long lengths of the same waveguide structure. This permits the co-planar integration of optical sources, optical modulators and photo-detectors without the need for complicated and cumbersome fabrication steps such as regrowth. Numerous applications of monolithic integrated photonic circuits can be envisioned. For example, an optical signal processor can be made by putting an optical source, two modulators and a photo-detector in series. The entire signal processor could be less than 1 $mm^2$ in area, offering a substantial advantage over optical signal processors which use external sources and detectors as well as bulk optics. Another example is use of the circuit in fiber optic gyroscope for missile guidance to render all the active elements of optical source, modulator and detector on a single chip. This would result in a substantial reduction in both the size and weight as well as in the number of fiber-to-chip connections. Since this pig-tailing process usually accounts for about half of the cost of a sensor system, this would result in a large cost savings.

Although a particular embodiment and form of this invention has been illustrated, it is apparent that various modifications and embodiments of the invention may be made by those skilled in the art without departing from the scope and spirit of the foregoing disclosure. Accordingly, the scope of the invention should be limited only by the claims appended hereto.

We claim:

1. A method of fabricating a monolithically integrated photonic circuit on which optical sources, modulators and photo-detectors are coplanar and identical in internal structure, said method comprising the steps of:

a) growing and doping a semiconductor chip made up of layers that together exhibit positive-intrinsic-negative doping profile, the layers residing upon a semiconductor substrate and a middle layer containing multiple quantum wells therein;

b) depositing electrical contacts in even distribution on the chip;

c) patterning the chip with photoresist such that channel waveguides are designated, each waveguide having thereon an electrical contact and being separated from adjacent waveguides by electrical isolation gaps;

d) etching the chip to a pre-determined depth, thereby creating a photonic circuit with raised waveguides, each waveguide supporting an electrical contact;

e) applying electric current to the electrical contacts in pre-selected bias modes to cause the various waveguides to function as optical sources, optical modulators or photo-detectors.

* * * * *